United States Patent
Ebner et al.

(10) Patent No.: US 12,077,881 B2
(45) Date of Patent: Sep. 3, 2024

(54) CRYSTAL GROWTH APPARATUS

(71) Applicant: EBNER Industrieofenbau GmbH, Leonding (AT)

(72) Inventors: Robert Ebner, Leonding (AT); Ghassan Barbar, Gundelfingen (DE); Chih-Yung Hsiung, Leonding (AT); Bernd Gruhn, Göriach (AT)

(73) Assignee: EBNER Industrieofenbau GmbH, Leonding (AT)

( * ) Notice: Subject to any disclaimer, the term of this patent is extended or adjusted under 35 U.S.C. 154(b) by 115 days.

(21) Appl. No.: 17/296,217

(22) PCT Filed: Nov. 19, 2019

(86) PCT No.: PCT/EP2019/081770
§ 371 (c)(1),
(2) Date: May 21, 2021

(87) PCT Pub. No.: WO2020/104444
PCT Pub. Date: May 28, 2020

(65) Prior Publication Data
US 2022/0010457 A1 Jan. 13, 2022

(30) Foreign Application Priority Data
Nov. 22, 2018 (DE) .................. 10 2018 129 492.1

(51) Int. Cl.
C30B 35/00 (2006.01)
C30B 7/14 (2006.01)
C30B 25/14 (2006.01)

(52) U.S. Cl.
CPC .............. C30B 35/002 (2013.01); C30B 7/14 (2013.01); C30B 25/14 (2013.01)

(58) Field of Classification Search
CPC ......... C30B 25/08; C30B 25/14; C30B 29/06; C30B 29/20; C30B 35/002; C30B 7/14
See application file for complete search history.

(56) References Cited

U.S. PATENT DOCUMENTS 4,556,436 A * 12/1985 Addamiano ............ C30B 29/36
117/109
4,869,776 A 9/1989 Kitagawa et al.
(Continued)

FOREIGN PATENT DOCUMENTS

CN 201779995 U * 3/2011 ............... F27D 5/00
CN 102691100 A 9/2012
(Continued)

OTHER PUBLICATIONS

European Patent Office, English computer translation of JP 2000-319098 (Year: 2022).*
English computer translation of CN 201779995 U (Year: 2023).*

*Primary Examiner* — Matthew J Song
(74) *Attorney, Agent, or Firm* — Stoel Rives LLP

(57) ABSTRACT

The present invention relates to an apparatus for growing crystals. The apparatus comprises a chamber and a crucible being arranged in a heatable accommodation space of the chamber, wherein the crucible comprises an inner volume which is configured for growing crystals inside. The crucible comprises a bottom from which respective side walls extend to a top section of the crucible. The crucible comprises at least one a deposition section which is configured for attaching a seed crystal, wherein the deposition section is formed on at least one of the side wall and the top section of the crucible.

16 Claims, 2 Drawing Sheets

(56) References Cited

U.S. PATENT DOCUMENTS

| | | | |
|---|---|---|---|
| 5,704,985 A | 1/1998 | Kordina et al. | |
| 5,858,086 A | 1/1999 | Hunter | |
| 5,895,526 A | 4/1999 | Kitoh et al. | |
| 6,056,820 A * | 5/2000 | Balakrishna | C30B 25/00 |
| | | | 117/88 |
| 6,110,279 A | 8/2000 | Kito et al. | |
| 6,406,539 B1 * | 6/2002 | Shigeto | C30B 23/002 |
| | | | 117/88 |
| 6,451,112 B1 | 9/2002 | Hara et al. | |
| 10,697,086 B2 | 6/2020 | Wada et al. | |
| 2001/0029884 A1 | 10/2001 | Imaeda et al. | |
| 2004/0003495 A1 | 1/2004 | Xu | |
| 2009/0056619 A1 * | 3/2009 | Mueller | C30B 29/36 |
| | | | 117/200 |
| 2010/0159182 A1 * | 6/2010 | Straubinger | C30B 25/14 |
| | | | 428/66.7 |
| 2010/0319614 A1 * | 12/2010 | Satoh | C30B 29/403 |
| | | | 118/712 |
| 2011/0107961 A1 * | 5/2011 | Motoyama | C30B 29/406 |
| | | | 118/726 |
| 2012/0176681 A1 * | 7/2012 | Chang | C23C 18/1216 |
| | | | 977/773 |
| 2013/0171402 A1 * | 7/2013 | Straubinger | C30B 23/02 |
| | | | 117/106 |
| 2014/0123901 A1 | 5/2014 | Hara | |
| 2014/0264388 A1 | 9/2014 | Schmitt et al. | |
| 2014/0366807 A1 * | 12/2014 | Kim | C30B 23/00 |
| | | | 118/728 |
| 2015/0059641 A1 | 3/2015 | Schmitt et al. | |
| 2015/0361580 A1 * | 12/2015 | Huang | C30B 23/02 |
| | | | 117/109 |

FOREIGN PATENT DOCUMENTS

| | | | | |
|---|---|---|---|---|
| CN | 106480503 A | | 3/2017 | |
| CN | 206244927 U | | 6/2017 | |
| CN | 107177886 A | | 9/2017 | |
| CN | 107924823 A | | 4/2018 | |
| JP | 86266000 A | | 3/1987 | |
| JP | 2000219594 A | | 8/2000 | |
| JP | 2000319098 A | * | 11/2000 | ............ C30B 23/00 |
| JP | 2007500664 A | | 1/2007 | |
| JP | 2014084240 A | | 5/2014 | |
| JP | 2014224014 A | | 12/2014 | |
| RU | 2488650 C1 | | 7/2013 | |
| SU | 1132606 A1 | | 4/1991 | |
| WO | 9701658 A1 | | 1/1997 | |
| WO | 2012144872 A2 | | 10/2012 | |
| WO | 2013002539 A2 | | 1/2013 | |
| WO | 2015067552 A1 | | 5/2015 | |
| WO | 2020104444 A1 | | 5/2020 | |

* cited by examiner

CRYSTAL GROWTH APPARATUS

RELATED APPLICATIONS

This application is a national stage under 35 U.S.C. § 371 of International Application No. PCT/EP2019/081770, filed Nov. 19, 2019, which claims priority of German Patent Application No. 102018129492.1, filed Nov. 22, 2018.

FIELD OF INVENTION

The present invention relates to an apparatus for growing crystals and to a method for growing crystals.

ART BACKGROUND

A single crystal or monocrystalline solid is a material in which a crystal lattice of the entire sample is continuous and unbroken to the edges of the sample without grain boundaries. The absence of the defects associated with grain boundaries can give monocrystals unique properties, particularly mechanical, optical and electrical, which can also be anisotropic, depending on the type of crystallographic structure. These properties, in addition to making them precious in some gems, are industrially used in technological applications, especially in optics and electronics.

Crystal growth is the process where a pre-existing crystal becomes larger as more molecules or ions add in their positions in the crystal lattice. A crystal is defined as being atoms, molecules, or ions arranged in an orderly repeating pattern, a crystal lattice, extending in all three spatial dimensions. So crystal growth differs from growth of a liquid droplet in that during growth the molecules or ions must fall into the correct lattice positions in order, for a well-ordered crystal to grow.

Crystallization of a biological macromolecule such as protein is basically adapted to perform a treatment of eliminating a solvent from an aqueous or anhydrous solution containing the macromolecule thereby attaining a supersaturated state and growing a crystal, similarly to the case of a general low molecular weight compound such as inorganic salt. Typical methods therefor are e.g. a batch method, a dialysis method and a gas-liquid correlation diffusion method, which are chosen depending on the type, the quantity, the properties etc. of a sample.

For example, crystal growth may be used to obtain single crystals of semiconductors (e.g. silicon, germanium and gallium arsenide), metals (e.g. palladium, platinum, silver, gold), salts and synthetic gemstones.

A further application may be the growth of large cylindrical ingots, or boules, of single crystal silicon used in the electronics industry to make semiconductor devices like integrated circuits.

For growing crystals, a crucible is placed inside a furnace chamber. In order to form a crystal component, a seed crystal is arranged inside the crucible. The seed crystal is generally made of a desired crystal material which is the material of the crystal component to be formed. The furnace is heated up such that a crystal material inside the crucible is provided in a molten and liquid state. The crystal component is formed by growing the crystal component starting from the seed crystal at the bottom of the crucible.

However, it is difficult to provide a stable temperature, pressure and gas during a growing procedure. Thus, it is difficult to grow large sized and high quality single crystals made of SiC and Al2O3 etc.

SUMMARY

Hence, it is an object of the present invention to provide a furnace for growing crystals having homogeneous atmosphere for growing large crystals.

This object is solved by an apparatus for growing crystals and a method of growing crystals according to the independent claims.

According to a first aspect of the present disclosure, an apparatus for growing crystals is presented. The apparatus comprises a chamber and a crucible being arranged in a heatable accommodation space of the chamber, wherein the crucible comprises an inner volume which is configured for growing crystals inside. The crucible comprises a bottom from which respective side walls extend to a top section of the crucible. The crucible comprises at least one a deposition section which is configured for attaching a seed crystal, wherein the deposition section is formed on at least one of the side wall and the top section of the crucible.

According to a further aspect of the present disclosure, a method for growing crystals is presented. According to the method, a seed crystal is attached to a deposition section of a crucible, wherein the deposition section is formed on at least one of a side wall and a top section of the crucible. Furthermore, crystals are grown inside an inner volume of the crucible being arranged in a heatable accommodation space of a chamber.

The apparatus may be a furnace comprising the chamber which provides a heatable accommodation space for the crucible. The apparatus and the crucible, respectively, heat the inner volume of the crucible until a desired temperature is reached. The temperature which may be provided inside the inner volume may be 100° C. to 1400° C., preferably to approximately 2100° C. or more. The camber may comprise an insulating material, such that the inner volume of the crucible is thermally isolated from an environment, i.e. an intermediate volume, surrounding the housing.

The crucible comprises the inner volume in which the crystal growing takes place. Inside the crucible, a seed element may be placed. The seed element is made of a desired single crystal material, such as sapphire. Furthermore, a reaction fluid, e.g. a reaction liquid or reaction gas, such as a desired crystal material, e.g. high purity alumina crackle, is put into the inner volume of the crucible. If the temperature inside the crucible increases, the desired material within the reaction liquid/gas growth onto a surface of the seed crystal. The crucible may comprise a cylindrical shape having a circular, elliptical or rectangular base surface.

Inside the inner volume of the crucible, it is an aim to provide a desired temperature gradient for controlling the growth of crystal. However, it is difficult to provide for example higher temperatures in the bottom region than in other regions of the inner volume of the crucible due to convection.

Hence, according to an embodiment, the deposition of the seed crystal is located at deposition sections which are defined at side walls of the crucible or at a top region of the crucible. A seed crystal may be attached for example by a specific glue to the deposition sections. Furthermore, the deposition sections may form a step at the inner wall of the crucible, such that the seed crystal may be arranged onto the step forming the deposition section without any adhesive materials.

Hence, the crystal growth takes place spaced apart from the bottom in regions of the inner volume, which can be temperature controlled more precise. If the deposition sections are arranged at side walls of the crucible or at its top section, the crystals growth from the respective seed crystal is directed laterally from the sidewall of the crucible to the centre of the crucible or upside down, from the top of the crucible to the bottom of the crucible. Based on the lateral growth and a growth direction from the top to the bottom, a nucleation on the deposition sections is properly controlled so that atomic stacking faults can be reduced. Hence, the crystal growth takes place at a desired growing atmosphere within the inner volume of the crucible such that larger crystals may be grown.

According to an exemplary embodiment, the bottom is free of a deposition section for a seed crystal. Hence, the temperatures in the vicinity of the bottom within the inner volume do not affect the homogeneous crystal growth within the centre section and upper section of the crucible.

According to a further exemplary embodiment, the crucible extends between the bottom and the top section along a vertical direction. In other words, the bottom of the lowermost position of the crucible and the top section of the highest position of the crucible.

According to a further exemplary embodiment, the crucible comprises plurality of deposition sections, each being configured for attaching a respective seed crystal. The deposition sections are spaced apart from each other and are formed on at least one of the side wall and the top section of the crucible. Hence, from different lateral and top positions of the crucible, a plurality of crystals may be grown in the direction to the centre of the crucible.

According to a further exemplary embodiment, the crucible comprises at least one protrusion extending from an inner surface, in particular from the side wall or the top section of the crucible, into the inner volume, wherein the deposition section is formed at the protrusion. Hence, the deposition sections may form a step at the inner wall of the crucible, such that the seed crystal may be arranged onto the step forming the deposition section without any adhesive materials.

According to a further exemplary embodiment, the crucible comprises a plurality of protrusions extending from the inner surface of the crucible into the inner volume, wherein the protrusions are spaced apart from each other.

According to a further exemplary embodiment, the crucible comprises at least one nozzle, wherein the nozzle is configured for injecting a reaction fluid (e.g. the reaction liquid or gas) into the inner volume of the crucible.

In particular, according to a further exemplary embodiment, the at least one nozzle is configured for ejecting the reaction fluid/liquid in a direction towards one of the deposition sections. The reaction fluid/liquid may be a gas, a vapor or a liquid medium. Specifically, the reaction fluid/liquid may be a gas mixture or vapor mixture having a single or mixture of C—, H—, CH— solutions or vapor.

According to a further exemplary embodiment, the crucible comprises an ejection column element extending partially between the bottom and the top section of the crucible, wherein the ejection column element comprises the at least one nozzle. The ejection column element comprises a rod like shape and may be fixed for example to the bottom of the crucible. The ejection column element is for example a kind of showerhead comprising the plurality of nozzles, wherein each nozzle may be directed to a respective deposition side. Specifically, the ejection column element extends along a centre axis of the e.g. cylindrical shape of the crucible. Hence, the respective nozzles arranged at the ejection column element direct from the centre of the crucible to the side walls of the crucible. Furthermore, the top end of the ejection column element may be spaced to the top section of the crucible. At the top end of the ejection column element a respective nozzle may be arranged which directs to a deposition section located at the top section of the crucible.

According to a further exemplary embodiment, the ejection column element is coupled with a reaction liquid interface formed in the bottom of the crucible. Hence, the ejection column element are formed for example a hollow column or pillar, wherein the gas line extends from the bottom of the column to the respective nozzles arranged at the ejection column element.

According to a further exemplary embodiment, the crucible comprises an injection interface for injecting an injection fluid, e.g. an injection liquid or injection gas, wherein the injection interface is for example coupleable to a pressure regulating valve for regulating a pressure inside the inner volume. For example, the injection interface comprises one or a plurality of openings arranged for example in the top section of the crucible. Specifically, the injection interface may be arranged at an opposite location of the crucible with respect to the reaction liquid interface. Specifically, a pressure regulating valve is provided which regulates a pressure of the injection liquid between for example 1 mbar up to 10 bar, for example. The injection liquid may be injected in a liquid and/or gaseous state. The injection liquid may react with the reaction liquid. For example, the reaction may be a first component and the injection liquid may be a second component.

After reaction of the first component with the second component, a source material is generated which can be sublimated onto the seed crystal and the already formed crystal layer onto the seed crystal, respectively.

The pressure regulating valve for regulating a pressure inside the inner volume and the injection interface are coupled to inject liquid/gas and also to bleed of liquid/gas in order to reduce the pressure inside the crucible.

According to a further exemplary embodiment, wherein the chamber comprises a plurality of heating elements, which surround in particular an outer wall of the chamber to provide a heat energy to the crucible. The heating elements may also be arranged in the accommodation space between an outer wall of the chamber and the sidewall of the crucible. The heating elements may be for example tubes which surround the chamber and the crucible, respectively, wherein the tube comprises a heating medium, such as a hot liquid or hot gas. For example, the heating elements may be 1 surround the sidewalls and additionally the top and the bottom of the crucible.

According to a further exemplary embodiment, the plurality of heating elements are configured for heating up the inner volume to a temperature between 1350° C. and 1450° C.

According to a further exemplary embodiment, wherein the plurality of heating elements is selected from one of RF (radio frequency) heaters, resistive heaters and heating generators.

According to a further exemplary embodiment, an insulating material is provided arranged in the accommodation space between the crucible and a wall of the chamber. The insulating material keeps a thermal gradient of the space and protects the chamber wall.

According to a further exemplary embodiment, the crucible is made of a material selected from one of the group comprising metal based, oxide based, nitride based, carbon based and dense graphite.

According to a further exemplary embodiment, the apparatus comprises a growth power enhancing device to enhancing the nucleation of a crystal on the deposition site, wherein the growth power enhancing device is selected from one of the group consisting of a plasma source, microwave source and a laser source. The growth power enhancing device increases the temperature within the crucible, so that the growth speed of the crystal is increased. The temperature inside the crucible can be controlled by the growth power enhancing device more accurate than e.g. the heating elements surrounding the crucible. Hence, a base temperature can be controlled by the heating elements and a temperature change or a more detailed temperature profile within the crucible can be controlled by the growth power enhancing device.

The growth power enhancing device may be arranged directly inside the crucible (e.g. if the growth power enhancing device is a laser source) or outside of the crucible (e.g. if the growth power enhancing device is a microwave source). For example, a laser source may be installed at the top or bottom of the crucible.

According to a further exemplary embodiment of the method, a source material is provided in the crucible, wherein the source material is selected from one of the group consisting of solid phase material, liquid phase material and mixture phase material.

According to a further exemplary embodiment of the method, a reaction fluid/liquid is injected into the inner volume of the crucible, wherein the reaction fluid/liquid is selected from one of the group consisting of gas or vapor having single or mixture of C—, H—, CH— solution or vapor.

According to a further exemplary embodiment a source material is provided consisting of one of a reaction gas/liquid and an injection gas/liquid in the crucible, wherein the source material is selected from one of the group consisting of solid phase material, liquid phase material, gaseous phase and mixture phase material comprising a C—, H—, CH— solution. The reaction gas/liquid and the injection gas/liquid may comprise methyl silicochloroform (MTS) and e.g. precursors, such as —C5H5 or CxHy.

It has to be noted that embodiments have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

BRIEF DESCRIPTION OF THE DRAWING

The aspects defined above and further aspects of the present invention are apparent from the examples of embodiments to be described hereinafter and are explained with reference to the examples. The invention will be described in more detail hereinafter with reference to examples of embodiments but to which the invention is not limited.

DETAILED DESCRIPTION OF EXEMPLARY EMBODIMENTS

Figure 1:
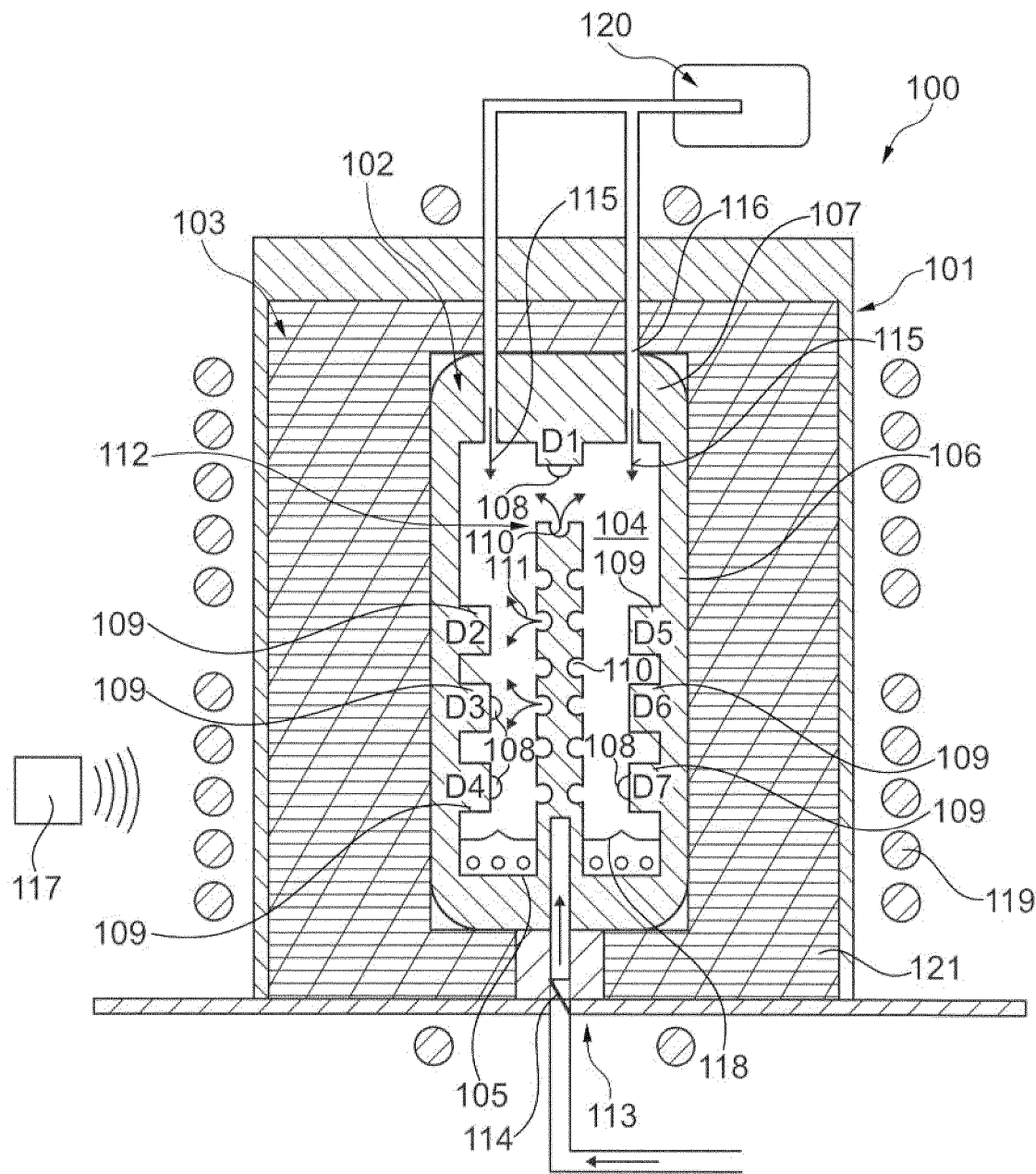
FIG. 1 shows a schematic view of the apparatus for growing crystals according to an exemplary embodiment.

The illustrations in the drawings are schematic. It is noted that in different figures similar or identical elements are provided with the same reference signs.

FIG. 1 shows a schematic view of the apparatus 100 for growing crystals according to an exemplary embodiment. The apparatus comprises a chamber 101 and a crucible 102 being arranged in a heatable accommodation space 103 of the chamber 101, wherein the crucible 102 comprises an inner volume 104 which is configured for growing crystals inside. The crucible 102 comprises a bottom 105 from which respective side walls 106 extend to a top section 107 of the crucible 102. The crucible 102 comprises at least one a deposition section which is configured for attaching a seed crystal 108, wherein the deposition section is formed on at least one of the side wall 106 and the top section 107 of the crucible 102.

The chamber 101 provides a heatable accommodation space 103 for the crucible 102. The apparatus 100 and the crucible 102, respectively, heat the inner volume 104 of the crucible until a desired temperature is reached. The temperature which may be provided inside the inner volume 104 may be 100° C. to 1400° C., preferably to approximately 2100° C. or more. The chamber 101 comprises an insulating material 121, such that the inner volume 104 of the crucible is thermally isolated from an environment, i.e. an intermediate volume, surrounding the chamber 101.

The crucible 102 comprises the inner volume 104 in which the crystal growing takes place. Inside the crucible 104, a seed element 108 is placed. The seed element 108 is made of a desired single crystal material, such as sapphire. Furthermore, a reaction gas/liquid 111, such as a desired crystal material, e.g. high purity alumina crackle, is injected into the inner volume 104 of the crucible 102. If the temperature inside the crucible 102 increases, the desired material within the reaction gas/liquid growth onto a surface of the seed crystal 108. The crucible 102 may comprise a cylindrical shape having a circular, elliptical or rectangular base surface.

The seed crystal 108 is located at deposition sections D1 to D7 which are defined at side walls 106 of the crucible 102 or at a top section 107 of the crucible 102. The seed crystal 108 is attached for example by a specific glue to the deposition sections D1 to D7. Furthermore, the deposition sections D1 to D7 form a step 109 at the inner wall 106 of the crucible 102, such that the seed crystal 108 may be arranged onto the step 109 forming the deposition section D1 to D7 without any adhesive materials.

Hence, the crystal growth takes place spaced apart from the bottom 105 in regions of the inner volume 104, which can be temperature controlled more precise. If the deposition sections D1 to D7 are arranged at side walls 106 of the crucible or at its top section 107, the crystals growth from the respective seed crystal 108 is directed laterally from the sidewall 106 of the crucible 102 to the centre of the crucible 102 or upside down, from the top section 107 of the crucible 102 to the bottom 105 of the crucible 102. Based on the lateral growth and a growth direction from the top section 107 to the bottom 105, a nucleation on the deposition sections D1 to D7 is properly controlled so that atomic stacking faults can be reduced. As can be taken from FIG. 1, the bottom 105 is free of a deposition section D1 to D7 for a seed crystal 108. Hence, the temperatures in the vicinity of the bottom 1005 within the inner volume 104 do not affect the homogeneous crystal growth within the centre section and upper section of the crucible 102.

As can be taken from FIG. 1, the crucible 102 comprises plurality of deposition sections D1 to D7, each being configured for attaching a respective seed crystal 108. The deposition sections D1 to D7 are spaced apart from each other and are formed on at least one of the side wall 106 and the top section 107 of the crucible 102. Hence, from different lateral and top positions of the crucible 100 to, a plurality of crystals may be grown in the direction to the centre of the crucible 100 to.

The deposition sections D1 to D7 are formed by protrusions extending from an inner surface, in particular from the side wall 106 or the top section 107 of the crucible 102, into the inner volume 104.

Furthermore, a nozzle 110 of the crucible 102 is shown which is configured for injecting a reaction gas/liquid into the inner volume 104 of the crucible 102. The nozzles 110 are configured for ejecting the reaction gas/liquid 111 in a direction towards one of the deposition sections D1 to D7. The reaction gas/liquid 111 may be a gas, a vapor or a liquid medium. Specifically, the reaction gas/liquid may be a gas mixture or vapor mixture having a single or mixture of C—, H—, CH— solutions or vapor.

The nozzles 110 are arranged within an ejection column element 112 extending from the bottom 105 at least partially to the top section 107 of the crucible 102. The ejection column element 112 comprises a rod like shape and is fixed to bottom 105 of the crucible 102. The ejection column element 112 is for example a kind of showerhead comprising the plurality of nozzles 110, wherein each nozzle 110 is directed to a respective deposition side D1 to D7. Specifically, the ejection column element 112 extends along a centre axis of the e.g. cylindrical shape of the crucible 102. Hence, the respective nozzles 110 arranged at the ejection column element 112 direct from the centre of the crucible 102 to the side walls 106. Furthermore, the top end of the ejection column element 112 is spaced to the top section 107 of the crucible 102. At the top end of the ejection column element 112 a respective nozzle 110 is arranged which directs to a deposition section D1 located at the top section 107 of the crucible 102.

The ejection column element 112 is coupled with a reaction gas/liquid interface 113 formed in the bottom 105 of the crucible 102. The ejection column element 112 comprises a gas line extending from the bottom 105 of the crucible 102 to the respective nozzles 110 arranged at the ejection column element 112.

The crucible 102 comprises an injection liquid/gas interface 116 for injecting an injection liquid/gas 115, wherein the injection liquid interface 116 is coupleable to a pressure regulating valve 114 for regulating a pressure inside the inner volume 104. For example, the injection liquid interface 116 comprises a plurality of openings arranged for example in the top section 107 of the crucible 102. The injection liquid interface 116 is arranged at an opposite location of the crucible 102 with respect to the reaction liquid interface 113.

A pressure regulating valve 120 is coupled to the injection liquid/gas interface 116. The pressure regulating valve 120 for regulating a pressure inside the inner volume and the injection liquid/gas interface 116 are coupled to inject liquid/gas and also to bleed of liquid/gas in order to control, i.e. increase or reduce, the pressure inside the crucible.

The chamber 101 comprises a plurality of heating elements 119, which surround in particular an outer wall of the chamber 101 to provide a heat energy to the crucible 102.

The apparatus 100 further comprises a growth power enhancing device 117 to enhancing the nucleation of a crystal on the deposition site D1 to D7, wherein the growth power enhancing device 117 is selected from one of the group consisting of a plasma source, microwave source and a laser source.

At the bottom 105 reaction gas/liquid 111 which is not used is gathered. Hence, because the deposition sides D1 to D7 are spaced apart from the bottom 105 and the bottom 105 is free of any deposition sides D1 to D7, the seed crystals 108 are not in contact with the reaction liquid 111 gathered at the bottom region of the crucible 102. Hence, reaction liquid 111 and the injection liquid 115 already injected from the nozzles 110 and liquid interfaces 116, respectively, to the deposition sides D1 to D7, reacts to the source material 118 and flows down to the bottom 105. The source material 118 gathered at the bottom 105 of the crucible 102 do not affect any more the growing of the crystals.

Figure 2:
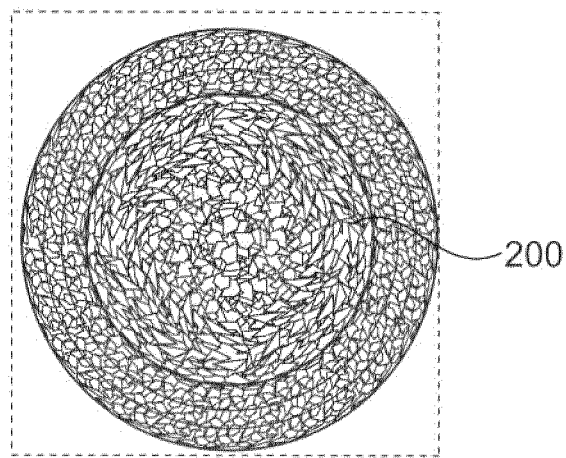
FIG. 2 shows a piece of polycrystalline formed at a top side deposition section of an apparatus according to an exemplary embodiment.

FIG. 2 shows a piece of polycrystalline 200 formed at a top side deposition section D1 of the crucible 102 shown in FIG. 1. In order to provide sufficient space for the grown crystal, the ejection column element 112 may be movable along a center (vertical) axis of the crucible 102, such that the distance between the top end nozzle 110 of the ejection column element 112 to the closest point of the grown crystal can be kept constant.

Figure 3:
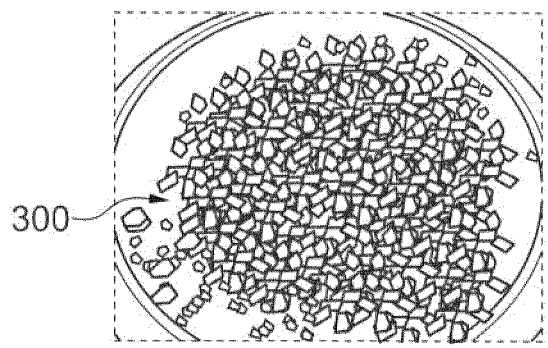
FIG. 3 shows multiple crystals at respective lateral deposition sections of an apparatus according to an exemplary embodiment.

FIG. 3 shows multiple crystals at respective lateral deposition sections D2 to D7 of the crucible 102 shown in FIG. 1. As can be taken from FIG. 3, a large number of respective crystals can be formed at the same time with one common crucible 102.

Figure 4:
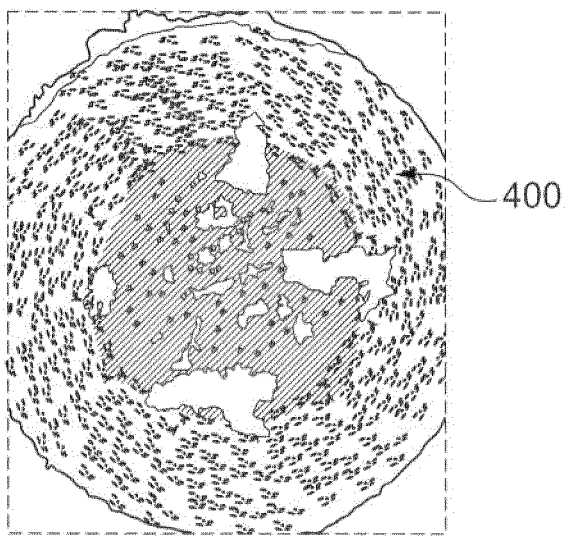
FIG. 4 shows multiple unoriented crystals generated below lateral deposition sections of an apparatus according to an exemplary embodiment.

FIG. 4 shows multiple unorientated crystals generated below lateral deposition sections (e.g. at undersides of deposition sections D2 to D7) of the crucible 102 shown in FIG. 1. The multiple unorientated crystals can be gathered and melted to receive the injection liquid and reaction liquid again.

It should be noted that the term "comprising" does not exclude other elements or steps and "a" or "an" does not exclude a plurality. Also elements described in association with different embodiments may be combined.

The invention claimed is:

1. An apparatus for growing crystals, the apparatus comprising:
 a chamber,
 a crucible arranged in a heatable accommodation space of the chamber, the crucible having a horizontally arranged bottom and at least one vertically arranged side wall extending from the bottom to a horizontally arranged top section of the crucible, the bottom, side wall, and top section bounding an inner volume of the crucible which is configured for growing crystals inside, the crucible having a plurality of deposition sections on the side wall, each deposition section including a protrusion extending from the side wall into the inner volume, each protrusion being configured for arranging a seed crystal thereon, wherein each protrusion has an upper surface, an end face and a lower surface, and wherein the deposition sections are spaced apart from each other so that the upper surface of a first one of the protrusions is at a distance below the lower surface of a neighboring second one of the protrusions, an ejection column element extending partially between the bottom and the top section of the crucible along a central vertical axis of the crucible, and a plurality of nozzles arranged on the ejection column element and configured for injecting a reaction fluid into the inner volume of the crucible, wherein each nozzle directs reaction fluid toward a respective one of the deposition sections.

2. The apparatus according to claim 1, wherein the bottom is free of a deposition section for a seed crystal.

3. The apparatus according to claim 1, wherein the crucible extends between the bottom and the top section along a vertical direction.

4. The apparatus according to claim 1,
wherein the crucible comprises at least one further protrusion extending from the top section of the crucible into the inner volume.

5. The apparatus according to claim 4,
wherein the crucible comprises a plurality of protrusions extending from an inner surface of the crucible into the inner volume,
wherein the protrusions are spaced apart from each other.

6. The apparatus according to claim 1,
wherein the ejection column element is coupled with a reaction fluid interface formed in the bottom of the crucible.

7. The apparatus according to claim 1,
wherein the crucible comprises an injection interface for injecting an injection fluid,
wherein the injection interface is coupleable to a pressure regulating valve for regulating a pressure inside the inner volume.

8. The apparatus according to claim 1, wherein the chamber comprises a plurality of heating elements, which surround an outer wall of the chamber to provide a heat energy to the crucible.

9. The apparatus according to claim 8, wherein the plurality of heating elements are configured for heating up the inner volume to a temperature between 1350° C. and 1450° C.

10. The apparatus according to claim 8, wherein the plurality of heating elements is selected from one of RF heaters, resistive heaters, and heating generators.

11. The apparatus according to claim 1, further comprising an insulating material arranged in an accommodation space between the crucible and a wall of the chamber.

12. The apparatus according to claim 1, wherein the crucible is made of a material selected from one of the group comprising metal based, oxide based, nitride based, carbon based, and graphite.

13. The apparatus according to claim 1, further comprising
a growth power enhancing device to enhancing the nucleation of a crystal on the deposition section,
wherein the growth power enhancing device is selected from one of the group consisting of a plasma source, microwave source and a laser source.

14. The apparatus according to claim 1, wherein each protrusion forms a step at the side wall for supporting the seed crystal thereon.

15. A method for growing crystals, the method comprising
arranging a seed crystal on each of a plurality of deposition sections within an inner volume of a crucible, wherein each deposition section includes a protrusion formed on a vertically arranged side wall of the crucible that extends upwardly from a bottom of the crucible to a horizontally arranged top section of the crucible, the bottom, side wall and top section bounding the inner volume of the crucible, each protrusion having an upper surface, an end face and a lower surface, and the deposition sections being spaced apart from each other so that the upper surface of a first one of the protrusions is at a distance below the lower surface of a neighboring second one of the protrusions, and wherein arranging each seed crystal on its respective deposition section includes arranging the seed crystal onto the protrusion of said deposition section, and while the crucible is arranged in a heated accommodation space of a chamber, injecting a reaction fluid into the inner volume of the crucible via a nozzle plurality of nozzles arranged on an ejection column element that extends partially between the bottom and the top section of the crucible along a central vertical axis of the crucible, wherein each of the nozzles is arranged to direct the reaction fluid toward a respective one of the deposition sections.

16. The method for growing crystals according to claim 15, wherein each protrusion forms a step at the side wall and the seed crystal is arranged onto the step without adhesives.

* * * * *